United States Patent [19]

Hickernell et al.

[11] Patent Number: 5,313,177
[45] Date of Patent: May 17, 1994

[54] METHOD AND APPARATUS FOR AN ACOUSTIC WAVE FILTER

[75] Inventors: Thomas S. Hickernell, Tempe; David Penunuri, Fountain Hills, both of Ariz.

[73] Assignee: Motorola, Inc., Schaumburg, Ill.

[21] Appl. No.: 864,263

[22] Filed: Apr. 6, 1992

[51] Int. Cl.$^5$ .......................... H03H 9/00; H03H 9/64
[52] U.S. Cl. ................................... 333/193; 333/195; 310/313 B
[58] Field of Search ............... 333/193, 194, 195, 196, 333/153, 154; 310/313 R, 313 B, 313 C, 313 D

[56] References Cited

U.S. PATENT DOCUMENTS

| | | | |
|---|---|---|---|
| 4,162,465 | 7/1979 | Hunsinger et al. | 333/151 |
| 4,162,466 | 7/1979 | Hunsinger et al. | 333/194 |
| 4,249,146 | 2/1981 | Yen et al. | 333/195 |
| 4,490,698 | 12/1984 | Morimoto | 333/193 |
| 4,492,940 | 1/1985 | Hikita | 333/194 |
| 4,513,261 | 4/1985 | Yen et al. | 333/196 |
| 4,577,169 | 3/1986 | Meeker et al. | 333/193 |
| 4,602,228 | 7/1986 | Yamada | 333/194 |
| 4,642,506 | 2/1987 | Lewis | 310/313 D |
| 4,649,357 | 3/1987 | Nagai et al. | 333/196 |
| 4,742,319 | 5/1988 | Sone | 333/195 |
| 4,760,359 | 7/1988 | Shiba et al. | 333/194 |
| 4,775,846 | 10/1988 | Shiba et al. | 333/154 |
| 4,837,476 | 6/1989 | Mochizuki | 310/313 R |
| 4,931,752 | 6/1990 | Bray et al. | 333/151 |
| 4,939,487 | 7/1990 | Yuhara et al. | 333/193 |
| 5,075,652 | 12/1991 | Sugai | 333/193 |
| 5,077,545 | 12/1991 | Gopani et al. | 333/195 |
| 5,128,640 | 7/1992 | Anemogiannis | 333/193 |
| 5,162,822 | 11/1992 | Wakamori | 333/193 |
| 5,202,652 | 4/1993 | Tabuchi et al. | 310/313 R |

OTHER PUBLICATIONS

D. Penunuri, F. M. Fliegel, F. S. Hickernell and F. Y. Cho, Motorola, Inc. Government Electronics Group, Scottsdale, Ariz., entitled "Single-Phase, Unidirectional Transducer Design for Charge Transport Devices", 1990, Ultrasonics Symposium, IEEE, 1990, pp. 237-241.

T. W. Grudkowski, G. K. Montress, M. Gilden and J. F. Black, "GaAs Monolithic SAW Devices for Signal Processing and Frequency Control", IEEE Catalogue No. 80CH1602-2, pp. 88-97, Sonics and Ultrasonics Symposium Proceedings for 1980.

M. H. Francome and S. V. Krishnaswamy, "Growth and Properties of Piezoelectric and Ferroelectric Films", in Journal of Vacuum Science and Technology A 8(3), pp. 1382-1390.

B. S. Kwak, E. P. Boyd and A. Erbil, "Metalorganic Chemical Vapor Deposition of PbTiO$_3$ Thin Films", Applied Physics Letters, 53(18), pp. 1702-1704.

Primary Examiner—Raymond A. Nelli
Attorney, Agent, or Firm—Frederick M. Fliegel

[57] ABSTRACT

A low-loss acoustic wave filter includes a piezoelectric substrate, a first strongly unidirectional acoustic wave transducer and a second strongly unidirectional acoustic wave transducer. Each of the first and second strongly unidirectional acoustic wave transducers are acoustically coupled to one another. Each of the first and second strongly unidirectional acoustic wave transducers further comprises an acoustic wave reflector and a weakly unidirectional acoustic wave transducer. The acoustic wave reflector and the weakly unidirectional acoustic wave transducer are coupled to the piezoelectric substrate.

22 Claims, 7 Drawing Sheets

METHOD AND APPARATUS FOR AN ACOUSTIC WAVE FILTER

CROSS-REFERENCE TO RELATED APPLICATIONS

This application is related to co-pending U.S. patent applications Ser. Nos. 694,516, filed on Mar. 16, 1991; 733,933, filed on Jul 22, 1991; 754,477, filed on Sep. 3, 1991; 793,925, filed on Nov. 8, 1991; and to U.S. Pat. No. 5,028,831, issued on Jul. 2, 1991, all of which are assigned to the same assignee as the present application.

FIELD OF THE INVENTION

This invention relates in general to the field of microelectronic frequency selection components, in particular to low insertion loss filters and delay lines and more particularly to acoustic wave devices employing unidirectional acoustic wave transducers.

BACKGROUND OF THE INVENTION

There is an ongoing need for acoustic wave filters and delay lines for a variety of practical applications. Acoustic wave devices are becoming particularly important in the production of electronic signal processing equipment, especially radios, because they can be readily mass produced and are of small size. Acoustic wave devices are generally constructed on planar surfaces using integrated circuit fabrication techniques.

A number of low-loss acoustic wave filter and transducer design approaches have been developed to meet specific performance goals relevant to particular applications and subject to specified manufacturing constraints. These approaches include multiphase unidirectional acoustic wave transducers, multi-transducer acoustic wave filters, resonators, distributed acoustic reflection transducers (DARTs) and acoustic wave transducers backed by reflectors, with each acoustic device type providing filter performance strengths and weaknesses.

Examples of these and other types of acoustic wave devices are described in U.S. Pat. No. 4,602,228, entitled "Surface acoustic wave filter", by J. Yamada; U.S. Pat. No. 4,492,940, entitled "Acoustic surface wave bandpass filter", by M. Hikita; U.S. Pat. No. 4,760,359, entitled "Surface acoustic wave resonator", by T. Shiba et al.; U.S. Pat. No. 4,837,476, entitled "Surface acoustic wave resonator having transducers and reflectors of different periods", by M. Mochizuki; U.S. Pat. No. 4,742,319, entitled "Surface-acoustic-wave resonator", by T. Sone; U.S. Pat. No. 4,249,146, entitled "Surface acoustic wave resonators utilizing harmonic frequencies", by K. Yen et al.; U.S. Pat. No. 4,162,465, entitled "Surface acoustic wave device with reflection suppression", by B. J. Hunsinger and K. Hanma; and U.S. Pat. No. 4,642,506, entitled "Surface acoustic wave device with reflectors in inter-electrode location", by M. F. Lewis, which are incorporated herein by reference. However, these and other prior art approaches suffer from a number of disadvantages well known in the art. These disadvantages tend to become more serious as operating frequency increases.

SUMMARY OF THE INVENTION

Accordingly, there is provided a new and improved acoustic wave device comprising an acoustic wave propagating substrate for sustaining an acoustic wave and a first acoustic wave reflector coupled to the acoustic wave propagating substrate. The first acoustic wave reflector reflects acoustic waves. A first weakly unidirectional acoustic wave transducer is also coupled to the acoustic wave propagating substrate. The first weakly unidirectional acoustic wave transducer converts electrical signals to acoustic waves and vice versa. The first acoustic wave reflector and the first weakly unidirectional acoustic wave transducer form a first low-loss acoustic wave transducer structure.

The acoustic wave device further desirably comprises a second acoustic wave reflector coupled to the acoustic wave propagating substrate. The second acoustic wave reflector reflects acoustic waves. A second weakly unidirectional acoustic wave transducer is coupled to the acoustic wave propagating substrate. The second weakly unidirectional acoustic wave transducer converts electrical signals to acoustic waves and vice versa. The second acoustic wave reflector and the second weakly unidirectional acoustic wave transducer form a second low-loss acoustic wave transducer structure. The first and second low-loss acoustic wave transducers form a low-loss acoustic wave filter.

The acoustic wave filter may further include another acoustic wave transducer coupled to the acoustic wave propagating substrate in between the first and second low-loss acoustic wave transducers. The third acoustic wave transducer converts energy between electrical signals and acoustic waves. The first and second low-loss acoustic wave transducers and the another acoustic wave transducer form a low-loss acoustic wave filter.

In a preferred embodiment, a low-loss acoustic wave filter includes in combination a piezoelectric substrate, a first strongly unidirectional acoustic wave transducer and a second strongly unidirectional acoustic wave transducer. Each of the first and second strongly unidirectional acoustic wave transducers further comprise an acoustic wave reflector and a weakly unidirectional acoustic wave transducer.

An improved radio frequency apparatus desirably includes at least one of the above-described low-loss acoustic wave filters for providing a frequency selection function, the low-loss acoustic wave filter operating to attenuate the electrical power level of between $0 \leq P \leq 0.75$.

The present invention further provides a method for providing a low-loss acoustic wave device. The method comprises the steps of providing an acoustic wave propagating substrate, coupling an acoustic wave reflector to the acoustic wave propagating substrate and coupling a weakly unidirectional acoustic wave transducer to the acoustic wave propagating substrate. The weakly unidirectional acoustic wave transducer has a directivity of less than six dB. The acoustic wave reflector and the weakly unidirectional acoustic wave transducer cooperate to provide a first low-loss acoustic wave transducer structure having a directivity of more than ten dB.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

A broad variety of different acoustic eigenmodes have applications in microwave acoustic devices. These include surface acoustic waves (SAWs), or Rayleigh waves; surface skimming bulk acoustic waves (SSBAWs); shallow bulk acoustic waves (SBAWs); surface transverse waves (STWs); Stonely, Sezawa, Love and other plate and higher order acoustic eigenmodes; longitudinal and shear bulk acoustic waves (BAWs); line acoustic waves (LAWs); et cetera.

For convenience of explanation, the present invention is described in terms of surface acoustic waves as an example, with the understanding that the techniques, methods and devices disclosed herein are applicable to other varieties of acoustic propagation mentioned above. The terms surface acoustic wave (SAW), acoustic wave and surface wave are employed interchangeably herein. The terms electrode, finger and/or comb electrode, with or without the adjective "interdigitated", are employed interchangeably herein to designate metallic strips employed as acoustic reflection elements and/or transduction elements.

Figure 1:
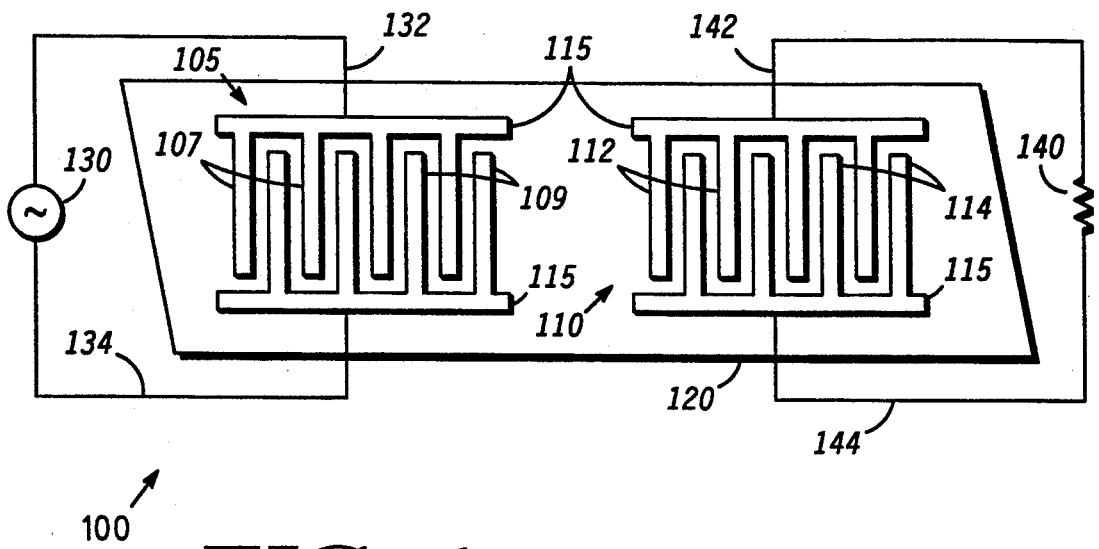
FIG. 1 is a simplified plan view of an acoustic wave filter according to the prior art.

FIG. 1 is a simplified plan view of acoustic wave filter 100 according to the prior art. Acoustic wave filter 100 comprises acoustic wave propagating substrate 120 and acoustic wave transducers 105 and 110 coupled to signal source 130 and load 140 via leads 132, 134 and 142, 144, respectively. Acoustic wave transducer 105 further comprises busses or bus bars 115 and comb electrodes 107 and 109. Acoustic wave transducer 110 further comprises busses 115 and comb electrodes 112 and 114.

Materials often employed for acoustic wave propagating substrate 120 include lithium niobate ($LiNbO_3$), lithium tantalate ($LiTaO_3$), bismuth germanium oxide ($BiGeO_{20}$), bismuth silicon oxide ($BiSiO_{20}$), quartz ($SiO_2$), gallium arsenide (GaAs), cadmium sulfide (CdS), aluminum nitride (AlN), zinc oxide (ZnO) and the like, shaped into thin plates or discs or layers and oriented to place a substrate surface into coincidence with a preferred crystallographic plane which includes a principal or preferred acoustic propagation direction. While stoichiometric chemical formulae are provided for the substances mentioned hereinabove, it should be understood that deviations from stoichiometry are common in various methods of substrate material preparation and that such variations are intended to be included in the descriptions of materials comprising substrate 120.

Acoustic wave transducers 105 and 110 convert electrical to acoustic energy and vice versa. Interdigitated comb electrodes 107, 109 and 112, 114 are interconnected by busses 115. Comb electrodes 107, 109, 112 and 114 and busses 115 are typically made of thin-film metal (e.g., aluminum and alloys thereof), deposited, for example, by vacuum evaporation or by RF sputter deposition, on the polished surface of acoustic wave propagating substrate 120 which is in whole or in part piezoelectric. Comb electrodes 107, 109, 112 and 114 and busses 115 making up acoustic wave transducers 105 and 110 are typically defined photolithographically, using processes similar to those used to manufacture integrated circuits, as is well known in the art.

Figure 2:
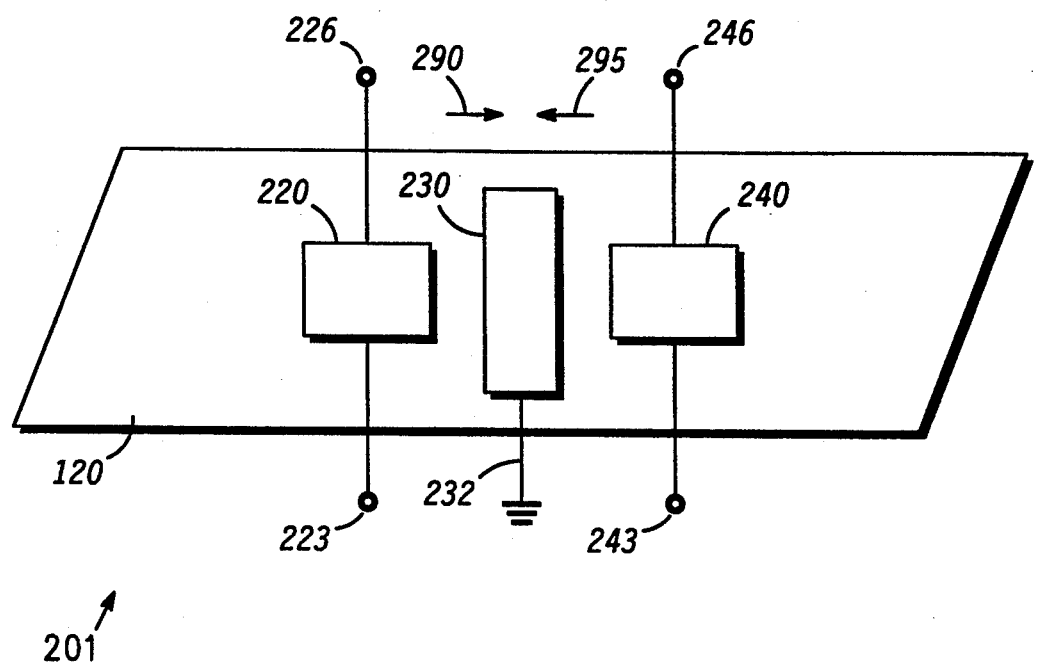
FIG. 2 is a simplified plan view of an acoustic wave filter in accordance with an embodiment of the present invention.
Figure 3:
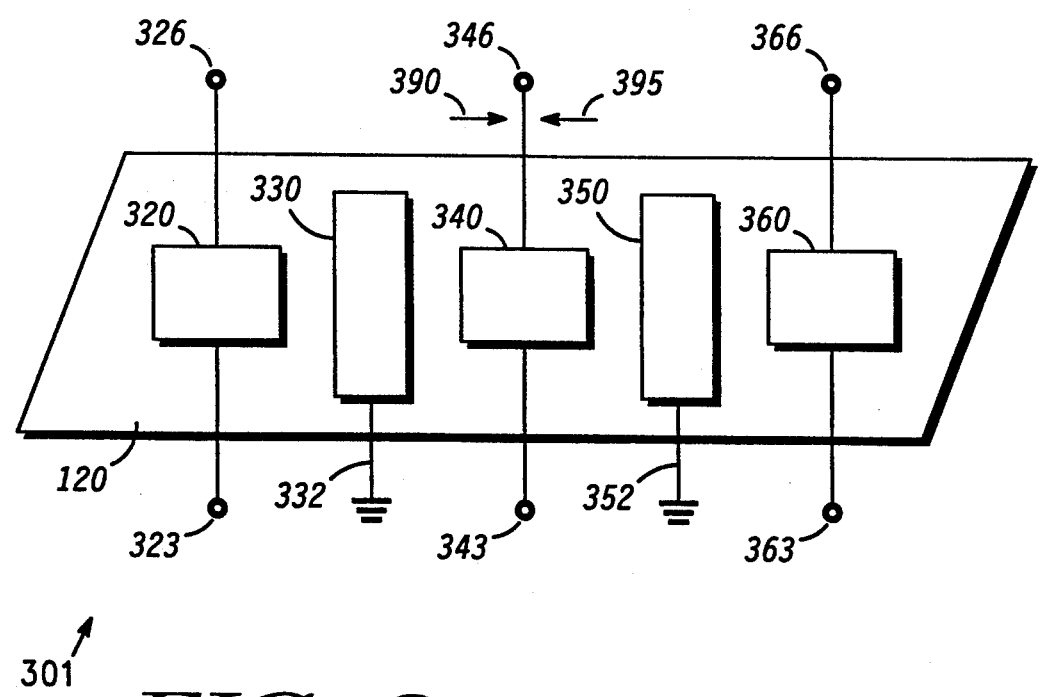
FIG. 3 is a simplified plan view of an acoustic wave filter in accordance with another embodiment of the present invention.
Figure 4:
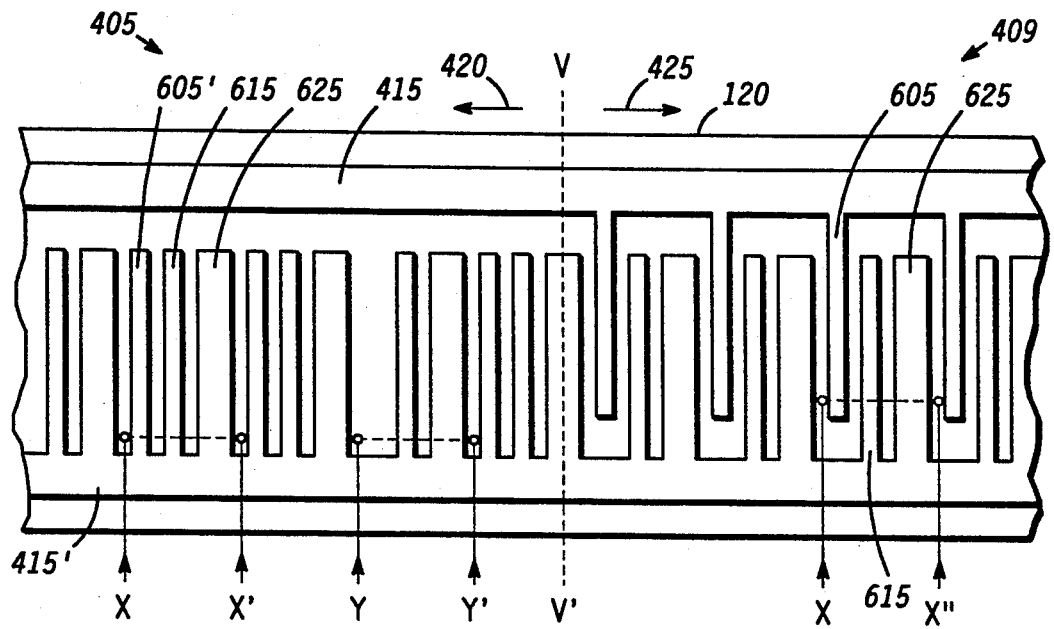
FIG. 4 is a simplified plan view of a portion of an acoustic wave device electrode pattern in accordance with an embodiment of the present invention.
Figure 5:
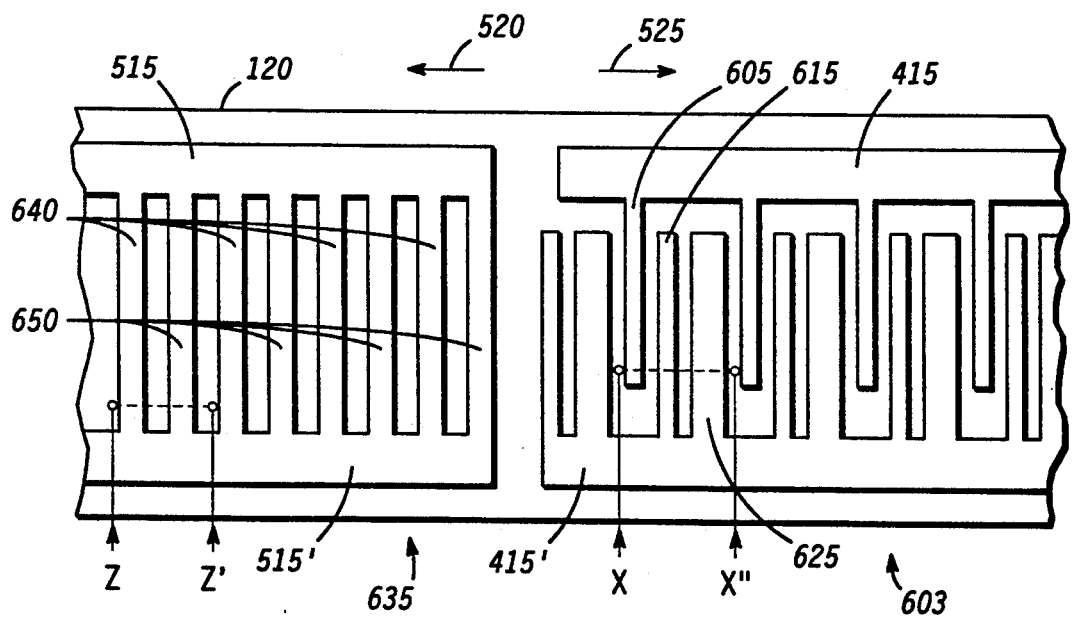
FIG. 5 is a simplified plan view of a portion of an acoustic wave device electrode pattern in accordance with another embodiment of the present invention.

FIGS. 2 and 3 are general plan views; FIGS. 4 and 5 are plan views in greater detail and FIGS. 6 through 9 show various cross sections illustrating the present invention in greater detail. The invention is best understood by considering FIGS. 2 through 9 together. The arrangement and operation of the present invention are described generally in connection with FIGS. 2-3 and then in greater detail in connection with FIGS. 4-9 wherein the unique features of the present invention will be more fully appreciated.

FIG. 2 is a simplified plan view of acoustic wave filter 201 in accordance with an embodiment of the present invention. Acoustic wave filter 201 comprises acoustic wave transducers 220 and 240 which are strongly unidirectional, having preferred directions of acoustic wave emission 290 and 295, respectively, together with optional shielding structure 230.

Acoustic wave filter 201 further comprises electrical interconnections 223 and 226 coupled to acoustic wave transducer 220 and electrical interconnections 243 and 246 coupled to acoustic wave transducer 240. Electrical interconnections 223 and 226 comprise a first electrical port of acoustic wave filter 201. Electrical interconnections 243 and 246 comprise a second electrical port of acoustic wave filter 201.

Optional shielding structure 230 may be coupled to electrical ground 232 as shown in FIG. 2 or may be floating (disconnected) or otherwise connected as appropriate.

Unidirectional acoustic wave transducers such as 220 and 240 each emit acoustic energy in both directions 290 and 295. A measure of the degree to which an acoustic wave transducer is unidirectional is the ratio of the acoustic energy or power $P_f$ emitted in the forward direction (direction 290, for example, with respect to acoustic wave transducer 220) to the acoustic energy or power $P_r$ emitted in the reverse direction (direction 295, for example, with respect to acoustic wave transducer 220). The ratio $P_f/P_r$ (or the inverse thereof) is called the directivity.

Directivity D may be expressed directly as a power ratio and is also often expressed in dB (D = $10 \log_{10} P_f/P_r$). Unidirectional acoustic wave transducers having directivities of 10 dB or more provide at least ten times as much acoustic power in one direction than in another and are strongly unidirectional. Unidirectional acoustic wave transducers having directivities of between 6 and 10 dB provide between four and ten times as much acoustic power in one direction than in another and are moderately unidirectional. Unidirectional acoustic wave transducers having directivities of less than 6 dB provide less than four times as much acoustic power in one direction than in another and are weakly unidirectional.

In operation, an input signal is applied, for example, to electrical interconnections 223 and 226. Electrical energy at an appropriate frequency (i.e., within the acoustic wave filter passband) causes acoustic waves to be emitted from acoustic wave transducer 220 in direction 290. Electrical energy at this frequency does not cause a significant amount of energy to be emitted from acoustic wave transducer 220 in direction 295 because acoustic wave transducer 220 is strongly unidirectional. Acoustic energy from acoustic wave transducer 220 is incident on acoustic wave transducer 240, thereby producing an electrical signal at electrical interconnections 243 and 246.

Similarly, electrical signals applied to electrical interconnections 243 and 246 cause acoustic wave emission from acoustic wave transducer 240 and subsequent reception by acoustic wave transducer 220, in turn producing electrical signals at electrical interconnections 223 and 226.

Electrical signals present at input connections 223 and 226 (or 243 and 246) not having frequencies within the acoustic wave filter passband do not excite significant acoustic energy and so do not cause electrical signals to be manifested at output connections 243 and 246 (or 223 and 226) to acoustic wave filter 201. Either of transducers 220 and 240 can function as an input with the other as an output.

FIG. 3 is a simplified plan view of acoustic wave filter 301 in accordance with another embodiment of the present invention. Acoustic wave filter 301 comprises acoustic wave transducers 320 and 360 which are strongly unidirectional, having preferred directions of acoustic wave emission 390 and 395, respectively. Acoustic wave filter 301 further comprises acoustic wave transducer 340 and optional shielding electrode structures 330 and 350 together with optional electrical grounds 332 and 352.

Acoustic wave transducer 340 may be a bidirectional acoustic wave transducer of any type. Acoustic wave filter 301 further comprises electrical interconnections 323, 326, 343, 346, 363 and 366.

Typically, electrical interconnections 323 and 363 are coupled together, as are electrical interconnections 326 and 366, to form a first electrical port of acoustic wave filter 301. Electrical interconnections 343 and 346 form a second electrical port of acoustic wave filter 301. Other arrangements of interconnections 323, 326, 343, 346, 363 and 366 are practical as appropriate to a particular acoustic wave filter design and application.

When an electrical signal is applied to the first electrical port, unidirectional acoustic waves are principally emitted by acoustic wave transducers 320 and 360 in directions 390 and 395, respectively, towards acoustic wave transducer 340. Acoustic waves impinging upon acoustic wave transducer 340 produce electrical signals at the second electrical port (electrical interconnections 343 and 346) of acoustic wave filter 301.

Similarly, electrical signals applied to electrical interconnections 343 and 346 give rise to acoustic waves travelling in directions 390 and 395. Those acoustic waves travelling in direction 390 are incident on acoustic wave transducer 360, while acoustic waves travelling in direction 395 are incident on acoustic wave transducer 320. Acoustic wave transducers 320 and 360 supply electrical signals to electrical interconnections 323, 326 and 363, 366, respectively, in response to incident acoustic waves.

Optional shielding structures 230 of FIG. 2 and 330 and 350 of FIG. 3 may comprise groups of strips or a single large strip fashioned of conductive material, as is well known in the art.

FIG. 4 is a simplified plan view of portion 401 of an acoustic wave device electrode pattern, in accordance with an embodiment of the present invention. Portion 401 comprises acoustic wave propagating substrate 120, acoustic reflector 405 and acoustic wave transducer 409. Dashed line V-V' is drawn in the vicinity of the juncture of acoustic reflector 405 and acoustic wave transducer 409 merely as an aid to understanding.

Acoustic wave reflector 405 comprises bus bars 415 and 415' and electrodes 605', 615 and 625. Acoustic wave transducer 409 comprises bus bars 415 and 415' and electrodes such as 605, 615 and 625. Acoustic waves propagate in directions 420 (to the left, as shown in FIG. 4) and 425 (to the right) within acoustic wave transducer 409 and are predominantly emergent from the combination of acoustic wave transducer 409 and acoustic wave reflector 405 in direction 425.

Electrodes 605, 615 and 625 of acoustic wave transducer 409 comprise an example of a unit cell (by way of example, X-X" of FIG. 4). A plurality of unit cells, not necessarily all identical, form acoustic wave transducer 409 having distributed acoustic reflections disposed therein. When an electrode such as 605' is substituted for electrode 605, a unit cell (by way of example, X-X') of reflector structure 405 is formed, not having acoustic transduction incorporated therein. All of the electrodes contained in reflector structure 405 are connected to at most only one of bus bars 415 or 415'.

A key feature of the arrangement depicted in FIG. 4 is that when no transduction or reflection weighting versus position is desired, the width and spacing of electrodes 605', 615 and 625 and electrodes 605, 615 and 625 are the same and the difference between a transducer unit cell and a reflector unit cell is the connection of one electrode of this cell (e.g., 605 or 605') to one bus bar or the other (e.g., 415 or 415').

Alternatively, filter performance requirements necessitating modification of the strength of acoustic reflection and/or transduction versus position along the transducer (e.g., along directions 420, 425 and 520, 525 of FIGS. 4 and 5) can be met by varying the electrode patterns and/or widths within various unit cells comprising the overall transducer/reflector structure in accordance with design principles well known in the art, with attendant increases in the complexities of acoustic wave filter design and manufacturing. The theory of acoustic wave transducer design including acoustic reflection and energy storage effects is described in Chapter 2 of "Circuit-Model Analysis and Design of Interdigital Transducers for Surface Acoustic Wave Devices" (*Physical Acoustics*, Vol. XV, published by Academic Press, Inc., 1981).

FIG. 5 is a simplified plan view of portion 501 of an acoustic wave device electrode pattern, in accordance with another embodiment of the present invention. Portion 501 comprises acoustic wave propagating substrate 120 having principal acoustic wave propagation directions 520 and 525, acoustic wave transducer 603 and acoustic wave reflector 635. Acoustic wave transducer 603 comprises bus bars 415 and 415' and electrodes 605, 615 and 625. Electrodes 605, 615 and 625 comprise a unit cell such as X-X", similar to cell X-X" in FIG. 4. Acoustic wave reflector 635 comprises bus bars 515 and 515' together with electrodes 640 and 650. Electrodes 640 and 650 may be coupled to both, either or neither of bus bars 515 and 515'. Further, either or both bus bars 515 and 515' may be omitted.

An electrode 640 and an electrode 650 together comprise a unit cell (by way of example, Z-Z') of acoustic wave reflector 635. Acoustic waves are launched in principal acoustic wave propagation directions 520 and 525 by acoustic wave transducer 603. Acoustic waves travelling in direction 520 which impinge upon acoustic wave reflector 635 are reflected thereby and subsequently propagate largely in direction 525. Acoustic waves are thus primarily emergent from the combination of acoustic wave transducer 603 and acoustic wave reflector 635 in direction 525.

The present invention relates to the coupling of weakly unidirectional acoustic wave transducers such as 409 and 603 with acoustic reflectors such as 405 and 635 of FIGS. 4 and 5, respectively, to provide strongly unidirectional acoustic wave transducers having low insertion loss coupled with broad bandwidth in small size. Portions 401 and/or 501 of FIGS. 4 and 5, respectively, correspond to acoustic wave transducers 220 and 320 of FIGS. 2 and 3. Acoustic wave transducers 240 and 360 correspond to mirror images of portions 401 and/or 501 of FIGS. 4 and 5.

Figure 6:
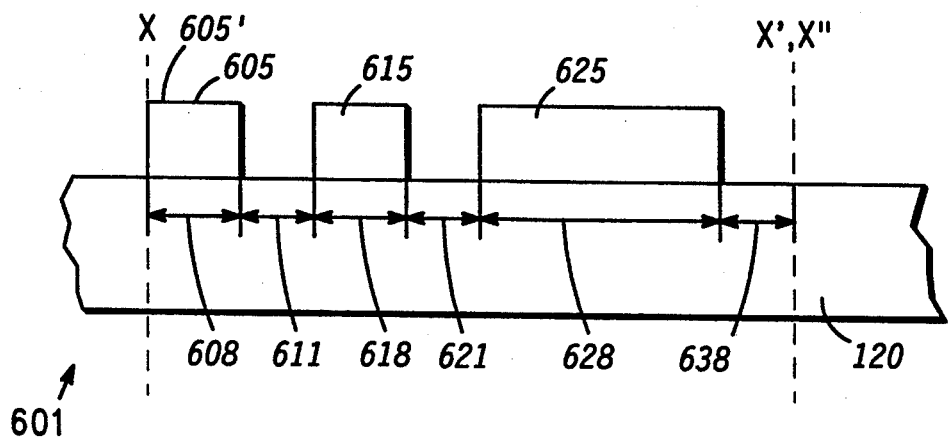
FIG. 6 is a simplified and enlarged side view, in section, taken on section lines X-X' or X-X" of FIGS. 4 or 5, of a portion of the acoustic wave transducer and/or reflector structures thereof in accordance with an embodiment of the present invention.

FIG. 6 is a simplified and enlarged side view, in section, taken on section lines X-X' or X-X" of FIGS. 4 or 5, of portion 601 of acoustic wave transducers 409 and 603 and/or acoustic wave reflector 405 thereof in accordance with embodiments of the present invention. Portion 601 comprises acoustic wave propagating substrate 120 and electrodes 605 (or 605'), 615 and 625 having widths 608, 618 and 628, respectively, disposed thereon, separated by gaps having breadths 611, 621 and 638, respectively.

Widths 608 and 618 are usefully in the range from one-twelfth of an acoustic wavelength to about one-fifth of an acoustic wavelength or larger. Width 628 is usefully in the range from about one-fifth of an acoustic wavelength to about one-half of an acoustic wavelength or larger. Widths 608 and 618 are preferably approximately one-eighth of an acoustic wavelength while width 628 is preferably approximately three-eighths of an acoustic wavelength. Widths 608 and 618 may be chosen to be identical to one another or may be chosen to be different.

Breadths 611, 621 and 638 are usefully in the range from about one-twelfth of an acoustic wavelength to about one-sixth of an acoustic wavelength or larger and preferably are about one-eighth of an acoustic wavelength. Breadths 611, 621 and 638 may be chosen to be the same within a unit cell or may be chosen to be different. Similarly, widths 608, 618 and 628 and breadths 611, 621 and 638 may vary from one unit cell to another.

Figure 7:
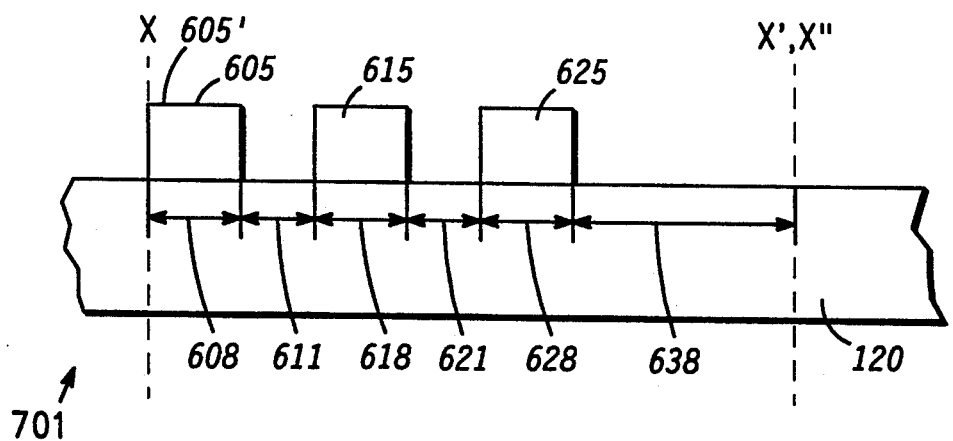
FIG. 7 is a simplified and enlarged side view, in section, taken on section lines X-X' or X-X" of FIGS. 4 or 5, of a portion of the acoustic wave transducer and/or reflector structures thereof in accordance with another embodiment of the present invention.

FIG. 7 is a simplified and enlarged side view, in section, taken on section lines X-X' or X-X" of FIGS. 4 or 5, of portion 701 of acoustic wave transducers 409 and 603 and/or acoustic wave reflectors 405 and 635 thereof in accordance with another embodiment of the present invention in which widths 608, 618 and 628 are substantially the same. Portion 701 comprises acoustic wave propagating substrate 120 and electrodes 605 (or 605'), 615 and 625 having substantially widths 608, 618 and 628, respectively, disposed thereon, separated by gaps having breadths 611, 621 and 638, respectively.

Widths 608, 618 and 628 and breadths 611 and 621 are usefully in the range from about one-twelfth of an acoustic wavelength to about one-fifth of an acoustic wavelength or larger and preferably are about one eighth of an acoustic wavelength. Breadth 638 is usefully in the range from about three-tenths of an acoustic wavelength or smaller to about one-half of an acoustic wavelength or larger and is preferably chosen to be about three-eighths of an acoustic wavelength.

Figure 8:
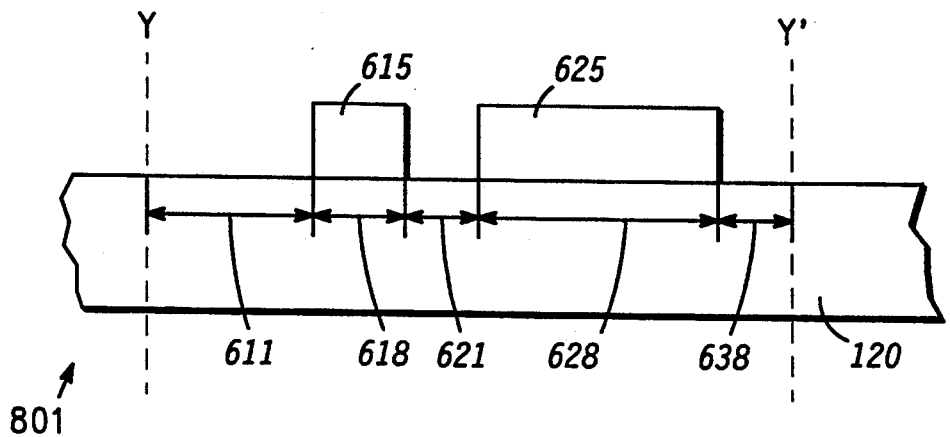
FIG. 8 is a simplified and enlarged side view, in section, taken on section lines Y-Y' of FIG. 4, of a portion of the acoustic wave transducer and/or reflector structures thereof in accordance with another embodiment of the present invention.

FIG. 8 is a simplified and enlarged side view, in section, taken on section lines Y-Y' of FIG. 4, of portion 801 of acoustic wave transducer 409 and/or reflector structure 405 thereof in accordance with yet another embodiment of the present invention. Portion 801 comprises acoustic wave propagating substrate 120 and electrodes 615 and 625 having widths 618 and 628, respectively, disposed thereon, separated by gaps having breadths 611, 621 and 638, respectively.

Breadths 611 and 638 usefully have a total width (i.e., breadths 611+638) in the range from about three-tenths of an acoustic wavelength or smaller to about one-half of an acoustic wavelength or larger and preferably have a total width (i.e., breadths 611+638) of about three-eighths of an acoustic wavelength. (Note that since FIG. 8 depicts a unit cell cross-section, breadths 611 and 638 of similar adjacent cells adjoin in the actual physical structure.) Width 628 is usefully in the range from about three-tenths of an acoustic wavelength or smaller to about one-half of an acoustic wavelength or larger and is preferably about three-eighth of an acoustic wavelength. Breadth 621 and width 618 are usefully in the range from about one-twelfth of an acoustic wavelength to about one-fifth of an acoustic wavelength or larger and are preferably about one-eighth of an acoustic wavelength.

Figure 9:
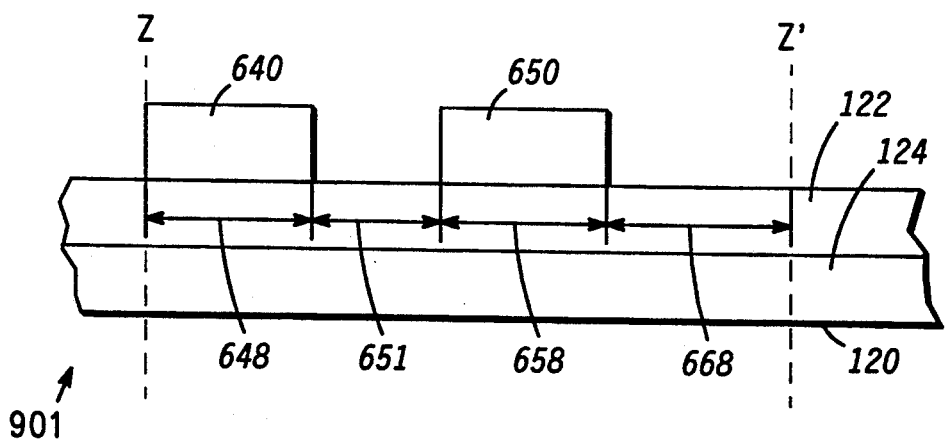
FIG. 9 is a simplified and enlarged side view, in section, taken on section lines Z-Z' of FIG. 5, of a portion of the acoustic wave reflector structure thereof in accordance with another embodiment of the present invention.

FIG. 9 is a simplified and enlarged side view, in section, taken on section lines Z-Z' of FIG. 5, of portion 901 of acoustic reflector structure 635 thereof in accordance with another embodiment of the present invention. Portion 901 comprises acoustic wave propagating substrate 120 and electrodes 640 and 650 having widths 648 and 658, respectively, disposed thereon, separated by gaps having breadths 651 and 668, respectively.

A particular feature of the arrangements shown in FIGS. 4 through 8 is that the electrode configurations shown provide distributed acoustic reflections throughout the transducer and/or reflector structures formed thereby. A key feature of these electrode configurations is that the distributed internal reflections of acoustic waves are disposed asymmetrically with respect to the transduction of acoustic waves. This latter feature is required in order to effect unidirectional acoustic wave transduction by means of distributed internal reflections within acoustic transducers.

As shown in FIG. 9, acoustic wave propagating substrate 120 may comprise a planar element of a crystalline or amorphous material 124 upon which a thin layer of a piezoelectric material 122 has been deposited. Thin-film piezoelectric material 122 may comprise, for example, zinc oxide, as discussed in "GaAs Monolithic SAW Devices for Signal Processing and Frequency Control," by T. W. Grudkowski, G. K. Montress, M. Gilden and J. F. Black, IEEE Catalogue No. 80CH1602-2, pages 88–97, or aluminum nitride, as discussed in "Growth and Properties of Piezoelectric and Ferroelectric Films," by M. H. Francome and S. V. Krishnaswamy, in Journal of Vacuum Science and Technology A 8(3), pages 1382–1390, or lithium niobate or other ferroelectric material, as discussed in the above and in "Metalorganic Chemical Vapor Deposition of $PbTiO_3$ Thin Films," by B. S. Kwak, E. P. Boyd and A. Erbil, in Applied Physics Letters, 53(18), pages 1702–1704. As discussed above and elsewhere, in conjunction with optional layer 122, material 124 may comprise semiconductor materials such as by way of example diamond, silicon, germanium, gallium arsenide, ternary, quaternary and other IV-IV, III-V, II-VI and mixed semiconductor materials and alloys, insulators such as glass or fused quartz, for example, metals or other any other material having suitable acoustic, chemical and electronic properties.

Optional layer 122 in practice often comprises a plurality of layers of materials chosen, for example, to increase the adhesion of optional layer 122 to material 124, or to encourage a particular crystallographic orientation of optional layer 122. While FIG. 9 shows electrodes 640 and 650 as being disposed atop material 124 and optional layer 122, it is to be understood that electrodes 640 and 650 are often disposed between material 124 and optional layer 122. FIG. 9 is intended to encompass all such alternatives, modifications and variations as are commonly practiced in the art. These variations also apply to the structures illustrated in FIGS. 6 through 8.

Widths 648 and 658 may be chosen to be nominally the same or may be chosen to be different (e.g., $w_o +/- \partial$, where $w_o$ represents a nominal width and $\partial$ a deviation) within a unit cell. Widths 648 and 658 may be chosen to vary from one unit cell to another. Similarly, breadths 651 and 668 may be chosen to be nominally the same or may be chosen to be different (e.g., $b_o -/+ \mu$, where $b_o$ represents a nominal breadth and $\mu$ a deviation) within a unit cell and breadths 651 and 668 may be chosen to vary from one unit cell to another.

Widths 648 and 658 and breadths 651 and 668 are preferably about one-fourth of an acoustic wavelength in one embodiment of the present invention. Widths 648 and 658 and breadths 651 and 668 are preferably about one-half of an acoustic wavelength in another embodiment of the present invention. Specific embodiments as mentioned hereinabove are chosen to suit the desired filter characteristics and the acoustic properties of the electrode and substrate materials employed in accordance with principles and calculations which are well known in the art (see, for example, *Physical Acoustics*, supra).

Widths 608, 618 and 628 and breadths 611, 621 and 638 of FIGS. 6 through 9 may be tailored according to principles known in the art (see, for example, *Physical Acoustics*, supra) to vary the acoustic reflection magnitude versus position within an acoustic transducer to achieve specific performance parameters or alternatively to provide acoustic reflection parameters which do not vary appreciably with process-induced variations in electrode width and/or interelectrode gap breadth (e.g., electrode width variations resulting from over- or under-etching, over- or under-exposure or development of the photoresist et cetera). This can be accomplished, for example, by choosing widths such that the reflection properties of one electrode will increase as electrode width decreases while an adjacent electrode's reflection properties decrease as electrode width decreases.

EXAMPLE

Figure 10:
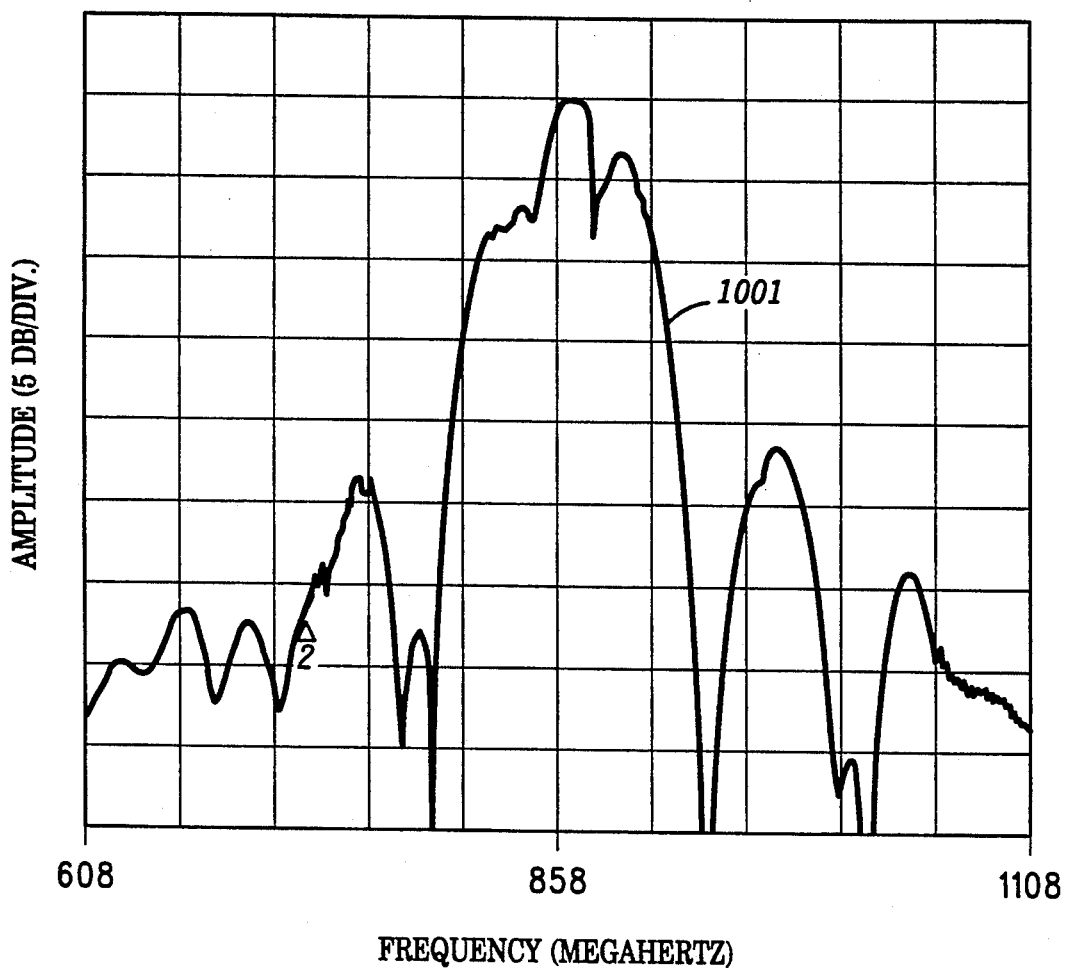
FIG. 10 is a graph of an experimentally measured frequency response of an acoustic wave filter of the type depicted in FIG. 3 in accordance with the present invention.

FIG. 10 is a graph of experimentally measured frequency response 1001 of a filter of the type depicted in FIGS. 3, 5, 6 and 9, in accordance with the present invention. The vertical scale is five dB per division, with the vertical reference level (first horizontal line below the top of FIG. 10) set to −2.17 dB. The horizontal axis is calibrated to 50 MegaHertz per division, with the center line corresponding to a frequency of 858 MegaHertz.

The experimental filter was fabricated using conventional integrated circuit microelectronic fabrication process steps on a substrate of 128° Y-rotated, X-propagating $LiNbO_3$ (lithium niobate) employing a single layer aluminum metallization 2400 Angstroms thick. An acoustic wavelength of 4.466 micrometers was chosen, providing a center frequency of about 860.2 MegaHertz.

The experimental filter comprised distributed acoustic reflector transducers or DARTs (e.g., 320 and 360 of FIG. 3) 12 wavelengths long together with reflectors (e.g., 635 of FIG. 5) 100 wavelengths long. The transducers and reflectors were each separated by a space about $6/11^{ths}$ of a wavelength wide. The reflectors comprised one hundred electrodes each one-half of an acoustic wavelength in width and separated by gaps one-half of an acoustic wavelength in breadth. The electrodes comprising the reflectors were connected to both bus bars (e.g., bus bars 515 and 515' of FIG. 5). The center acoustic wave transducer (e.g., 340 of FIG. 3) comprised an unweighted acoustic wave transducer 10.5 wavelengths long, employing electrodes having widths of one-fourth of an acoustic wavelength, separated by gaps having breadths of one-fourth of an acoustic wavelength.

Frequency response 1001 depicts an insertion loss of about 2.17 dB at a center frequency of about 860.2 MegaHertz, together with a 3 dB bandwidth of about 20 MegaHertz. The out-of-band signal rejection shown by the data of FIG. 10 exceeds 20 dB for frequencies more than 75 MegaHertz removed from the center frequency and exceeds 28 dB for frequencies more than 150 MegaHertz removed from the center frequency. Frequency response 1001 shows that low insertion loss, broad passband bandwidth and strong out-of-band signal rejection are obtained from an acoustic wave filter according to the present invention. The acoustic wave filter has a small size.

Figure 11:
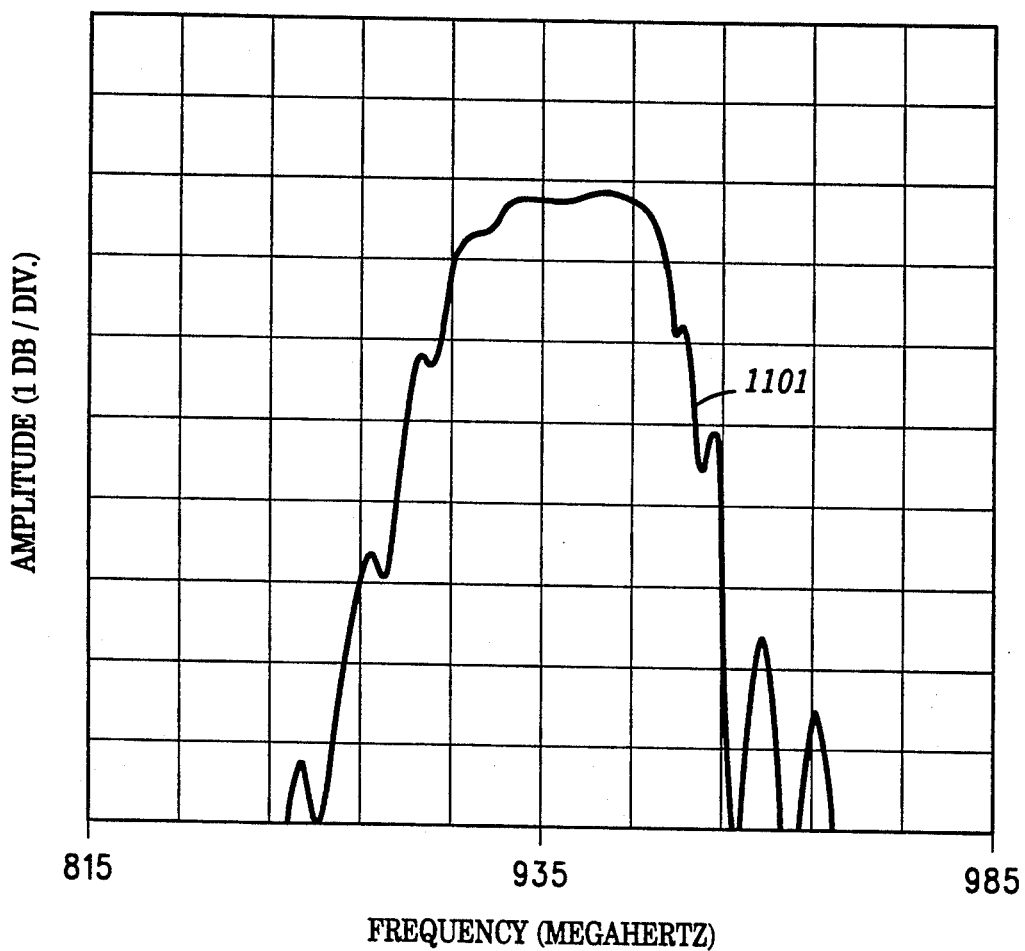
FIG. 11 is a graph of an experimentally measured frequency response of an acoustic wave filter of the type depicted in FIG. 2 in accordance with the present invention.

FIG. 11 is a graph of experimentally measured frequency response 1101 of an acoustic wave filter of the type depicted in FIGS. 2, 4 and 8 in accordance with the present invention. The vertical scale is one dB per division, with the vertical reference level (top horizontal line, FIG. 11) set to 0 dB. The horizontal axis is calibrated to 5 MegaHertz per division, with the center line corresponding to a frequency of 935 MegaHertz.

The experimental acoustic wave filter was fabricated using conventional microfabrication steps on a substrate of 128° Y-rotated, X-propagating $LiNbO_3$ employing a single layer aluminum metallization 2040 Angstroms thick. An acoustic wavelength of 4.134 micrometers was chosen, providing a center frequency of about 935 MegaHertz. Width 618 and breadth 621 (FIG. 8) were chosen to be about 0.14 wavelength or 0.57876 micrometers, width 628 was chosen to be about 0.33 wavelength or 1.364 micrometers, while breadths 611 and 638 totalled about 0.39 wavelength or 1.612 micrometers.

Frequency response 1101 depicts an insertion loss of about 2.27 dB at a center frequency of about 935 MegaHertz, together with a 3 dB bandwidth of about 15 MegaHertz. Frequency response 1101 shows that low insertion loss, broad passband bandwidth and rapid passband to out-of-band response transition with frequency are provided in an acoustic wave filter having a small form factor, e.g., the chips containing the filters of FIGS. 10 and 11 measured approximately 2.5 by 2.0 millimeters.

Figure 12:
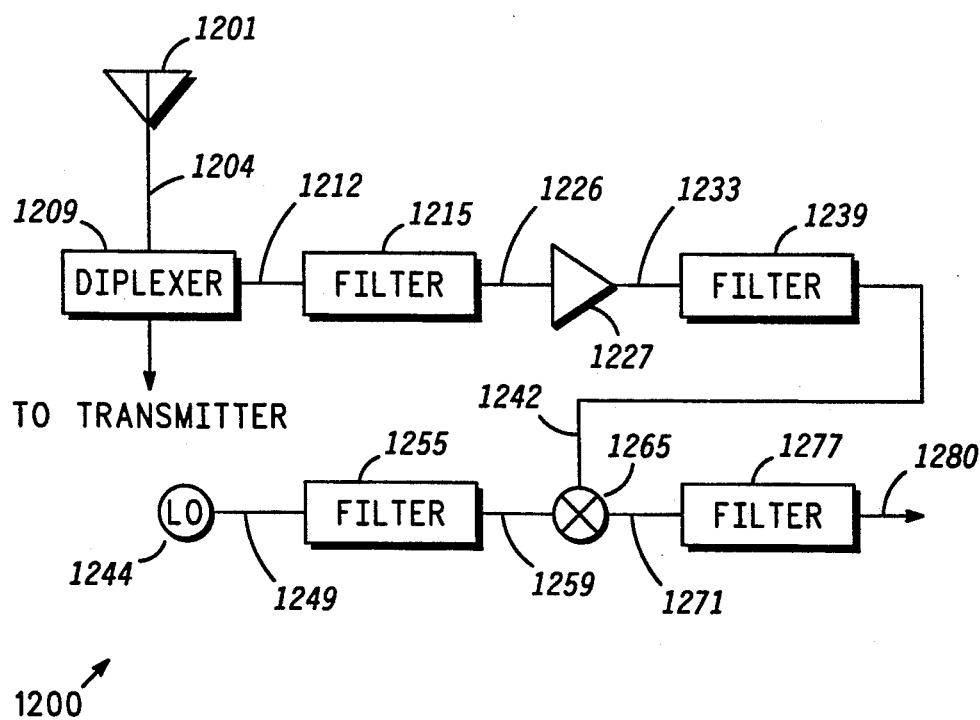
FIG. 12 is a block diagram of a portion of a radio frequency apparatus including acoustic wave filters in accordance with the present invention.

FIG. 12 is a block diagram of portion 1200 of a radio or other communications apparatus including one or more acoustic wave filters in accordance with the present invention. Apparatus 1200 includes antenna 1201 and antenna lead 1204, by way of example, used to receive and/or transmit signals.

Alternatively, antenna 1201 and antenna lead 1204 could be replaced by a fiber-optic link or a cable or other signal transmissive media. Diplexer 1209 is coupled to antenna 1201 and antenna lead 1204 and to a transmitter portion (not shown). Diplexer 1209 couples received signals to filter 1215 via lead 1212. Filter 1215 is coupled to amplifier 1227 via lead 1226.

The output of amplifier 1227 is coupled to filter 1239 via lead 1233. Filter 1239 couples its output signal to mixer 1265 where the signal coupled by lead 1242 is combined with another signal from local oscillator 1244 coupled via filter 1255 and leads 124 and 1259. The signal which is output from mixer 1265 via lead 1271 is then passed through filter 1277 to provide an intermediate frequency or IF output signal via lead 1280.

Diplexer 1209, filter 1215, filter 1239, filter 1255 and/or filter 1277 may comprise acoustic wave filters according to the present invention.

METHOD

A method for providing a low-loss acoustic wave transducer comprises steps of providing an acoustic wave propagating substrate and coupling an acoustic wave reflector to the acoustic wave propagating substrate. The method further comprises the step of coupling a weakly unidirectional acoustic wave transducer to the acoustic wave propagating substrate. The weakly unidirectional acoustic wave transducer has a directivity of less than six dB. The weakly unidirectional acoustic wave transducer desirably but not essentially incorporates distributed internal reflections disposed asymmetrically with respect to transduction. The acoustic wave reflector and the weakly unidirectional acoustic wave transducer thereby form a first low-loss acoustic wave transducer having a directivity of more than ten dB.

The method further desirably but not essentially comprises steps of coupling a second acoustic wave reflector to the acoustic wave propagating substrate and coupling a second weakly unidirectional acoustic wave transducer to the acoustic wave propagating substrate. The second acoustic wave reflector and the second weakly unidirectional acoustic wave transducer thereby form a second low-loss acoustic wave transducer. The first and second low-loss acoustic wave transducers thereby form a low-loss acoustic wave filter having an insertion loss of less than four dB.

The method further desirably comprises steps of coupling a first electrical port to the first low-loss acoustic wave transducer and coupling a second electrical port to the second low-loss acoustic wave transducer to provide a low-loss acoustic wave filter. The method further desirably but not essentially comprises a step of coupling another acoustic wave transducer to the acoustic wave propagating substrate in between the first and second low-loss acoustic wave transducers. The first and second low-loss acoustic wave transducers and the another acoustic wave transducer thereby form a low-loss acoustic wave filter. The method further desirably but not essentially includes steps of providing a first shielding electrode structure between the first low-loss acoustic wave transducer and the another acoustic wave transducer and providing a second shielding electrode structure between the second low-loss acoustic wave transducer and the another acoustic wave transducer. The method desirably but not essentially further comprises the steps of grounding the first and second shielding electrode structures. The method alternatively desirably but not essentially includes a step of providing a first shielding electrode structure between the first and second low-loss acoustic wave transducer.

An acoustic wave filter apparatus and method have been described which overcome specific problems and accomplish certain advantages relative to prior art methods and mechanisms. The improvements over known technology are significant. For example, broader bandwidth together with reduced insertion losses are provided via acoustic wave filters in accordance with the present invention. The expense, complexities and/or high parts count of group-type and other multi-phase unidirectional acoustic wave transducers are avoided, as are the need for hand adjustment of phasing networks. The fabrication process is especially simple, requiring only single level metallization patterning accomplished, for example, by conventional photolithography. Similarly, the restricted bandwidth limitations of resonator-type acoustic wave filters are not encountered in the present invention because the acoustic wave transducers employed therein utilize distributed acoustic wave reflections together with transduction. The insertion loss limitations of conventional unidirectional acoustic wave transducers are avoided by including acoustic wave reflectors in addition to weakly unidirectional acoustic wave transducers.

Thus, there has also been provided, in accordance with an embodiment of the present invention, an acoustic wave filter and method having the advantages of single-level photolithographic processes and so of fabrication simplicity, small size, low passband insertion loss and high out-of-band signal rejection, together with broad passband bandwidth, that fully satisfies the aims and advantages set forth above.

While the invention has been described in conjunction with specific embodiments, many alternatives, modifications and variations will be apparent to those of ordinary skill in the art in light of the foregoing description. Accordingly, the invention is intended to embrace all such alternatives, modifications and variations as fall within the spirit and broad scope of the appended claims.

We claim:

1. A method for making an acoustic wave device, said method comprising steps of:
   providing an acoustic wave propagating substrate;
   forming a first acoustic wave reflector on said acoustic wave propagating substrate; and
   forming a first weakly unidirectional acoustic wave transducer on said acoustic wave propagating substrate adjacent to said first acoustic wave reflector in a first direction of acoustic wave propagation, the weakly unidirectional acoustic wave transducer having a directivity of less than six decibels, the acoustic wave reflector and the weakly unidirectional acoustic wave transducer thereby forming a first low-loss acoustic wave transducer having a directivity of more than ten decibels.

2. A method as claimed in claim 1, further comprising steps of:
   forming a second acoustic wave reflector on said acoustic wave propagating substrate; and
   forming a second weakly unidirectional acoustic wave transducer on said acoustic wave propagating substrate adjacent to said second acoustic wave reflector in a second direction of acoustic wave propagation opposite said first direction of acoustic wave propagation, the second acoustic wave reflector and the second weakly unidirectional acoustic wave transducer thereby forming a second low-loss acoustic wave transducer, the first and second low-loss acoustic wave transducers thereby forming a low-loss acoustic wave filter having an insertion loss of less than four decibels.

3. A method as claimed in claim 2, further comprising steps of:
   coupling a first electrical port to said first weakly unidirectional acoustic wave transducer; and
   coupling a second electrical port to said second weakly unidirectional acoustic wave transducer to provide a low-loss acoustic wave device.

4. A method as claimed in claim 2, further comprising a step of:
   forming another acoustic wave transducer on said acoustic wave propagating substrate in between said first and second weakly unidirectional acoustic wave transducers, said first and second weakly unidirectional acoustic wave transducers, said first and second acoustic wave reflectors and said another acoustic wave transducer forming a low-loss acoustic wave device.

5. A method as claimed in claim 4, further comprising steps of:
   forming a first shielding electrode structure between said first weakly unidirectional acoustic wave transducer and said another acoustic wave transducer; and
   forming a second shielding electrode structure between said second weakly unidirectional acoustic wave transducer and said another acoustic wave transducer.

6. A method as claimed in claim 5, wherein forming a first and second shielding electrode structure further comprises steps of grounding said first and second shielding electrode structures.

7. A method as claimed in claim 2, further comprising a step of forming a first shielding electrode structure between said first and said second weakly unidirectional acoustic wave transducers.

8. An acoustic wave device comprising:
   an acoustic wave propagating substrate for sustaining an acoustic wave;
   a first acoustic wave reflector disposed on said acoustic wave propagating substrate; and
   a first weakly unidirectional acoustic wave transducer disposed on said acoustic wave propagating substrate adjacent to said first acoustic wave reflector in a first direction of acoustic wave propagation, said first weakly unidirectional acoustic wave transducer for converting electrical signals to acoustic waves and vice versa, said first acoustic wave reflector and said first weakly unidirectional acoustic wave transducer thereby forming a first low-loss acoustic wave transducer structure.

9. An acoustic wave filter as claimed in claim 8, further comprising:
   a second acoustic wave reflector disposed on said acoustic wave propagating substrate; and
   a second weakly unidirectional acoustic wave transducer coupled to said acoustic wave propagating substrate adjacent to said second acoustic wave reflector in a second direction of acoustic wave propagation opposite said first direction of acoustic wave propagation said second weakly unidirectional acoustic wave transducer for converting electrical signals to acoustic waves and vice versa, said second acoustic wave reflector and said second weakly unidirectional acoustic wave transducer thereby forming a second low-loss acoustic wave transducer, said first and second low-loss acoustic wave transducers thereby forming a low-loss acoustic wave filter.

10. An acoustic wave filter as claimed in claim 9, further comprising an acoustic wave transducer disposed on said acoustic wave propagating substrate in between said first and second weakly unidirectional acoustic wave transducers, said acoustic wave transducer for converting energy between electrical signals and acoustic waves, said first and second low-loss acoustic wave transducers and said acoustic wave transducer thereby forming a low-loss acoustic wave filter.

11. An acoustic wave filter as claimed in claim 8, wherein said first weakly unidirectional acoustic wave transducer comprises unit cells, each of said unit cells further comprising:
   a first electrode having a first width, said first electrode disposed on said acoustic wave propagating substrate; and
   a second electrode having a second width disposed on said acoustic wave propagating substrate, said second width being in a range of from twice to four times said first width.

12. An acoustic wave filter as claimed in claim 8, wherein said first weakly unidirectional acoustic wave transducer comprises unit cells, each of said unit cells further comprising:
a first electrode having a first width;
a second electrode having a second width; and
a third electrode having a third width, said first, second and third electrodes disposed on said acoustic wave propagating substrate, said third width being in a range of from one and a half to five times said first width.

13. An acoustic wave filter as claimed in claim 8, wherein said acoustic wave propagating substrate comprises a member of a group consisting of lithium niobate, lithium tantalate, bismuth germanium oxide, bismuth silicon oxide, quartz, gallium arsenide, silicon, cadmium sulfide, aluminum nitride and zinc oxide.

14. An acoustic wave device including in combination:
a piezoelectric substrate;
a first strongly unidirectional acoustic wave transducer disposed on said piezoelectric substrate; and
a second strongly unidirectional acoustic wave transducer disposed on said piezoelectric substrate, each of said first and second strongly unidirectional acoustic wave transducers acoustically coupled to one another, each of said first and second strongly unidirectional acoustic wave transducers having a directivity of at least ten decibels and further comprising:
an acoustic wave reflector disposed on said piezoelectric substrate; and
a weakly unidirectional acoustic wave transducer having a directivity of less than six decibels disposed on said piezoelectric substrate adjacent to said acoustic wave reflector, said weakly unidirectional acoustic wave transducer for converting between electrical and acoustic energy.

15. An acoustic wave device as claimed in claim 14, further comprising:
another acoustic wave transducer disposed on said piezoelectric substrate and positioned between said first and second strongly unidirectional acoustic wave transducers, said another acoustic wave transducer providing a first port of said acoustic wave device, said first and second strongly unidirectional acoustic wave transducers providing a second port of said acoustic wave device.

16. An acoustic wave device as claimed in claim 14, wherein said piezoelectric substrate comprises a member of a group consisting of lithium niobate, lithium tantalate, bismuth germanium oxide, bismuth silicon oxide, quartz, gallium arsenide, silicon, cadmium sulfide, aluminum nitride and zinc oxide.

17. An acoustic wave device as claimed in claim 14, wherein said acoustic wave reflector comprises electrodes having widths of about one-half of an acoustic wavelength.

18. An electronic apparatus employing acoustic waves, including:
at least one low-loss acoustic wave filter for providing a frequency selection function and operating to attenuate the electrical power level of signals in the passband thereof by a factor P ranging between $0 \leq P \leq 0.75$, said at least one low-loss acoustic wave filter comprising:
an acoustic wave propagating substrate;
a first strongly unidirectional acoustic wave transducer disposed on the acoustic wave propagating substrate; and
a second strongly unidirectional acoustic wave transducer disposed on the acoustic wave propagating substrate, said first and second strongly unidirectional acoustic wave transducers acoustically coupled to one another, each of said first and second strongly unidirectional acoustic wave transducers having a directivity of more than ten decibels and further comprising:
an acoustic wave reflector disposed on said acoustic wave propagating substrate, said acoustic wave reflector for reflecting acoustic waves; and
a weakly unidirectional acoustic wave transducer having a directivity of less than six decibels disposed on said acoustic wave propagating substrate adjacent to said acoustic wave reflector, said weakly unidirectional acoustic wave transducer for converting between electrical and acoustic energy, wherein said acoustic wave reflector reflects acoustic waves towards said weakly unidirectional acoustic wave transducer to provide in combination a strongly unidirectional acoustic wave transducer.

19. An electronic apparatus as claimed in claim 18, further including:
another acoustic wave transducer disposed on said acoustic wave propagating substrate, separating and acoustically coupled to said first and second strongly unidirectional acoustic wave transducers, said another acoustic wave transducer electrically coupled to one port of said electronic apparatus, said first and second strongly unidirectional acoustic wave transducers electrically coupled to a second port of said electronic apparatus.

20. An electronic apparatus as claimed in claim 18, wherein said acoustic wave reflector comprises unit cells, each of said unit cells further comprising:
a first electrode having a first width, said first electrode disposed on said acoustic wave propagating substrate; and
a second electrode having a second width disposed on said acoustic wave propagating substrate, said second width being greater than said first width.

21. A method for manufacturing an acoustic wave device, said method comprising steps of:
providing an acoustic wave propagating substrate;
forming an acoustic wave reflector on said acoustic wave propagating substrate; and
forming a weakly unidirectional acoustic wave transducer, having a directivity of less than six decibels and having distributed internal acoustic reflection elements therein, on said acoustic wave propagating substrate adjacent to said acoustic wave reflector in a direction of acoustic wave propagation, the acoustic wave reflector and the weakly unidirectional acoustic wave transducer having a directivity of more than ten decibels.

22. An acoustic wave device comprising:
an acoustic wave propagating substrate for sustaining an acoustic wave;
a first acoustic wave reflector disposed on said acoustic wave propagating substrate; and
a first weakly unidirectional acoustic wave transducer having distributed internal acoustic reflection elements disposed on said acoustic wave propagating substrate adjacent to said first acoustic wave reflector in a direction of acoustic wave propagation, said first weakly unidirectional acoustic wave transducer for converting electrical signals to acoustic waves and vice versa, said first acoustic wave reflector and said first weakly unidirectional acoustic wave transducer thereby forming a first low-loss acoustic wave transducer structure.

* * * * *

UNITED STATES PATENT AND TRADEMARK OFFICE
CERTIFICATE OF CORRECTION

PATENT NO.  : 5,313,177
DATED       : May 17, 1994
INVENTOR(S) : Thomas S. Hickernell et al.

It is certified that error appears in the above-indentified patent and that said Letters Patent is hereby corrected as shown below:

Column 16, Claim 21, Line 57, insert --thereby forming a first low-loss acoustic wave transducer-- following "transducer".

Signed and Sealed this

Twenty-second Day of November, 1994

Attest:

BRUCE LEHMAN

*Attesting Officer*  *Commissioner of Patents and Trademarks*